United States Patent
Evans et al.

(10) Patent No.: US 9,553,470 B2
(45) Date of Patent: Jan. 24, 2017

(54) METHOD AND APPARATUS FOR CHARGING A LEAD ACID BATTERY

(75) Inventors: Rhodri Evans, Monmouthshire (GB); Wayne Coldrick, Newport (GB)

(73) Assignee: EH EUROPE GMBH, Zurich (CH)

(*) Notice: Subject to any disclaimer, the term of this patent is extended or adjusted under 35 U.S.C. 154(b) by 679 days.

(21) Appl. No.: 13/388,769

(22) PCT Filed: Jul. 27, 2010

(86) PCT No.: PCT/GB2010/001428
§ 371 (c)(1),
(2), (4) Date: Feb. 23, 2012

(87) PCT Pub. No.: WO2011/015805
PCT Pub. Date: Feb. 10, 2011

(65) Prior Publication Data
US 2012/0139475 A1     Jun. 7, 2012

(30) Foreign Application Priority Data
Aug. 6, 2009 (GB) .................................. 0913770.4

(51) Int. Cl.
*H02J 7/00* (2006.01)
*H02J 7/04* (2006.01)
*G01R 31/36* (2006.01)

(52) U.S. Cl.
CPC .............. *H02J 7/0085* (2013.01); *H02J 7/044* (2013.01); *G01R 31/3606* (2013.01)

(58) Field of Classification Search
CPC .................................................... H02J 7/0078
(Continued)

(56) References Cited

U.S. PATENT DOCUMENTS 3,740,636 A * 6/1973 Hogrefe ................ H02J 7/0078
                                                        136/291
3,906,329 A   9/1975 Bader
(Continued)

FOREIGN PATENT DOCUMENTS

CN    1327287 (A)    12/2001
CN    101399381 (A)   4/2009
(Continued)

OTHER PUBLICATIONS

Coldrick et al. "Development of Thin Plate Pure Lead-Acid systems for evolving reserve power applications," Telecommunications Energy Conference, 2007. INTELEC 2007. 29th International, pp. 102, 106, Sep. 30, 2007-Oct. 4, 2007.*
(Continued)

*Primary Examiner* — Richard Isla Rodas
*Assistant Examiner* — David H Henze-Gongola
(74) *Attorney, Agent, or Firm* — Myers Bigel, P.A.

(57) ABSTRACT

The invention relates to a method of operating a lead acid battery which undergoes discharging phases and charging phases in a cyclical fashion. The method involves monitoring the current discharged from the battery during a discharging phase and recording information relating to that current flow, such as the charge lost from the battery. During the subsequent charging phase, a desired amount of charge to be supplied to the battery is calculated based upon the recorded information, and then supplied to the battery.

16 Claims, 4 Drawing Sheets

(58) Field of Classification Search
USPC .................. 320/149, 124–125, 134; 324/427
See application file for complete search history.

(56) References Cited

U.S. PATENT DOCUMENTS

| | | | |
|---|---|---|---|
| 4,387,334 A | | 6/1983 | Loper |
| 4,413,220 A | * | 11/1983 | Waineo .......................... 320/118 |
| 5,160,880 A | | 11/1992 | Palanisamy |
| 5,631,533 A | | 5/1997 | Imaseki |
| 5,659,240 A | * | 8/1997 | King ..................... B60L 3/0046 |
| | | | 320/134 |
| 5,710,503 A | * | 1/1998 | Sideris et al. ................. 324/431 |
| 6,114,775 A | * | 9/2000 | Chung ..................... B60K 6/46 |
| | | | 180/65.245 |
| 6,160,376 A | | 12/2000 | Kumar et al. |
| 6,239,580 B1 | | 5/2001 | Toya |
| 6,337,560 B1 | * | 1/2002 | Kalogeropoulos ... H02J 7/0073 |
| | | | 320/125 |
| 2003/0102846 A1 | * | 6/2003 | Zauner .................. H02J 7/0077 |
| | | | 320/162 |
| 2004/0220758 A1 | | 11/2004 | Barsoukov et al. |
| 2005/0012496 A1 | | 1/2005 | Taniguchi |
| 2005/0134221 A1 | * | 6/2005 | Wanibuchi et al. .......... 320/128 |
| 2005/0134225 A1 | | 6/2005 | Mese et al. |
| 2005/0231164 A1 | * | 10/2005 | Melichar ............... H02J 7/0073 |
| | | | 320/132 |
| 2007/0210742 A1 | * | 9/2007 | Brecht .................. H02J 7/0091 |
| | | | 320/104 |
| 2008/0309286 A1 | | 12/2008 | Hoff |
| 2009/0033277 A1 | | 2/2009 | Ludtke |
| 2009/0112495 A1 | * | 4/2009 | Center ............... G01R 31/3679 |
| | | | 702/63 |

FOREIGN PATENT DOCUMENTS

| | | | |
|---|---|---|---|
| EP | 0 711 016 A2 | 5/1996 | |
| EP | 2 020 723 A2 | 2/2009 | |
| GB | 2 147 161 A | 5/1985 | |
| GB | 2147161 A * | 5/1985 | .......... G01R 31/362 |
| WO | WO 01/41281 A1 | 6/2001 | |

OTHER PUBLICATIONS

International Search Report and the Written Opinion for PCT/GB2010/001428 mailed on Dec. 13, 2010.
Search Report for GB 0913769.6 issued on Sep. 24, 2009.
Search Report for GB 0913770.4 issued on Sep. 24, 2009.
International Search Report and the Written Opinion for PCT/GB2010/01429 mailed on Dec. 7, 2010.
TPPL—a cost effective solution for genset starter batteries; Dec. 2008.

* cited by examiner

METHOD AND APPARATUS FOR CHARGING A LEAD ACID BATTERY

RELATED APPLICATIONS

This application is a 35 U.S.C. §371 national stage application of PCT Application No. PCT/GB2010/001428, filed on 27 Jul. 2010, which claims priority from Great Britain Patent Application No. 0913770.4, filed 6 Aug. 2009, the contents of which are incorporated herein by reference in their entireties. The above-referenced PCT International Application was published in the English language as International Publication No. WO 2011/015805 A1 on 10 Feb. 2011.

The present invention relates to methods of operating and charging a lead acid battery, to an apparatus for charging a lead acid battery and to an energy storage system comprising lead acid batteries and a charging apparatus.

In recent years many advances have been made to improve the efficiency and reliability of lead acid batteries. During the lifetime of a lead acid battery it will typically be discharged and charged many times. This is especially true in motive power applications such as forklift trucks, golf buggies and other battery powered vehicles including battery powered cleaning and polishing machines where the battery regularly is discharged during one period, for example, during the day and is charged in another period, for example, overnight. Even in some reserve power applications, for example, reserve power supplies for telecommunication systems, there may be a significant degree of cycling between a partially or fully discharged state and a full state of charge, for example, in locations where disruptions of the main power supply are frequent. During the cyclical discharging and charging of the battery side reactions occur which waste some of the energy supplied to charge the battery and which also gradually cause changes in the battery electrochemistry and materials resulting in eventual failure of the battery.

Battery charging systems can be categorised in three main groups. In the first group, referred to as "constant voltage systems", the charging system applies a constant voltage per cell. At the commencement of charging the current flow will be high, often at the peak value, (assuming the battery is in a state of significant discharge) and is often deliberately limited by the charging system in order to avoid damage to the battery. As the battery approaches a full state of charge, the equilibrium/rest voltage of the battery increases and the difference between that "at rest" voltage and the voltage applied by the charging systems decreases, thereby causing the current flowing into the battery to fall also. In the second type of system, known as "constant current" systems, the control algorithm of the charging system continuously adjusts the voltage per cell applied to the battery in order to maintain the current into the battery at a set level. The third type of system is essentially a hybrid of the first two, and can be referred to as a "hybrid system". In such a hybrid system the charging algorithm typically applies a constant voltage regime first until the battery is mostly charged and then switches to a constant current regime for a set period of time. Some hybrid systems have more complex algorithms which apply a number of phases of constant current and constant voltage, according to a predetermined routine. Other charging systems are also known, for example, pulse charging. The charging systems are typically controlled by a microprocessor which operates according to an algorithm. Charging systems of all types often also include a sensor for measuring the temperature of the battery, and the algorithm may be designed to adjust the charging voltage/current according to the measured temperature. Charging systems are typically dedicated to a particular type of battery and may be sold by the battery manufacturer together with the batteries as a package.

Some charging systems have algorithms which apply at predetermined intervals an extra charge, known as an equalisation charge, towards the end of a charging cycle or as an isolated charge. The equalisation charge is typically applied on a constant current basis. For example, an equalisation charge of, say, 2 Amps for 1 hour might be applied to a battery once a week with the aim of equalising the state of charge of the cells in a string.

Recently, systems have come on the market in which each battery is provided with a device fitted to the main DC cable of the battery to monitor and record data of current, voltage (potential difference), temperature and, optionally, electrolyte level. That data can be wirelessly downloaded to the charging station when the battery is brought to the station for charge, thereby giving the system operator useful information relating to the utilisation of the battery and also advising the user of any faults. One such system is the WI-IQ wireless battery monitoring device available from EnerSys Inc.

However, there remains a need to improve the lifetime cyclic capability and reliability of lead acid batteries.

In mitigation of that need, the present invention provides in a first aspect a method of operating a lead acid battery in which the battery undergoes discharging phases during which the battery is discharged and charging phases during which the battery is charged and which includes during a discharging phase, monitoring the current flow out of and into the battery, and recording information relating to that current flow;

during a subsequent charging phase, calculating, based upon that recorded information, a desired amount of charge to be supplied to that battery, and supplying that desired amount of charge to the battery.

The charge supplied to the battery during charging can be calculated as the product of the current supplied and the time. The product may be, for example, the integral of the current supplied with respect to time.

In a second aspect the invention provides a charging apparatus for charging a lead acid battery comprising:

a) communication means arranged to obtain information relating to the current flow out of and into the battery during use of the battery;

b) control means arranged to calculate, based upon the recorded information relating to the current flow out of and into the battery during use of the battery, a desired amount of charge to be supplied to the battery; and c) current supply means arranged to supply the calculated desired amount of charge to the battery.

In a third aspect the invention provides an energy storage and supply apparatus comprising:

one or more lead acid batteries;

means to monitor the current flow out of and into the or each battery during use of the or each battery;

means to record information relating to the current flow out of and into the or each battery during use of the or each battery; and a charging apparatus for charging the or each battery comprising control means arranged to calculate a desired amount of charge to be supplied to the or each battery based upon the recorded information relating to the current flow out of and into the or each battery during use of the or each battery.

The present inventors have found that the working lifetime of a lead acid battery can be extended if the amount of charge supplied to the battery during a charging phase is controlled in dependence on the net amount of charge that has been removed from the battery since it was last in a full state of charge state. The present inventors have found that the cycling lifetime of the battery can be improved if the charge supplied during recharging is controlled relative to the net amount of charge removed from the battery. The net amount of charge lost from the battery can be derived from the information relating to the current flow out of the battery and any current flow into the battery during the preceding discharging phase. (The information will typically include the level of the current and the duration of current flow, from which the charge can be calculated.) Current flow out of the battery will typically occur during use of the battery to power an external mechanism, such as a motor. Current flow into the battery during a discharging phase could arise, for example, when the battery is used on a fork lift truck having a braking system which generates electricity for supply back to the battery, or during a short duration charge during a work break such as a lunch break (such short charges where there is no possibility of charging the battery to a full state of charge are not regarded as "charging phases", as that term is used herein with respect to the method of the first aspect of the invention). By controlling the amount of charge supplied during a charging phase in this way, side reactions occurring during charging of the battery may be reduced, thereby extending the working lifetime of the battery.

In some applications, the discharging phases may be relatively long, for example, lasting a week or so, with the battery being provided with partial charges during lunch breaks and other convenient short periods to keep it at a reasonable level of charge, and the battery being charged in accordance with the method of the first aspect of the invention back to a full state of charge only when a longer time period is available, for example, at a weekend.

The term "discharging phase" as used herein refers to the period following a full charge of the battery to a full state of charge during which the battery is in use and is therefore in a state of partial or complete discharge, and has not yet begun to be fully charged again.

For the purposes of the present invention, a battery is regarded as being at a full state of charge when it has received the desired amount of charge in accordance with the method of the first aspect of the invention. Of course, it is important that when the battery is new, and before the first discharging phase according to the method of the first aspect takes place, the battery is at a full state of charge. The skilled person will understand how to charge the battery to a full state of charge, either by charging the battery for a certain length of time, or until the charging current falls to a certain level.

During a discharging phase of a lead acid battery in a motive power application, for example, a forklift truck battery, the battery will be at least partially discharged during operation of the forklift truck. When the charge in the battery drops to a certain level, say to around 20% of the capacity of the battery (which corresponds to the depth-of-discharge, or DOD, of 80%), the battery will be in need of charging and the operator will therefore take it to a charging station where it can be connected to a charging apparatus and charged. Once charged, the battery is fit for use again. Over the lifetime of the battery this cycling between discharged and charged states occurs many times. For example, a battery having a total charge capacity of 100 Amp hours might be specified by the manufacturer to give 600 discharge/charge cycles at a level of 80% depth-of-discharge.

During charging of the battery a voltage is applied to the battery which must obviously be greater than the voltage associated on load or post discharge in rest/equilibrium in order to reverse the chemical reactions which occur in the battery during the discharging phase. For example, for a lead acid battery which operates at a nominal voltage of, say, 2.0 Volts per cell the charging apparatus may apply a substantially constant charging voltage of, say, 2.35 Volts per cell. Such systems are known as "constant voltage" charging systems.

In a battery which has been discharged to a significant degree a typical charging phase may include an initial period during which the current supplied to the cell is maintained below a certain preset limit. For example, the current supply to the battery may be limited to 50 Amps. At a certain point during the charging process, however, the current flowing into the battery will fall below the preset limit. The voltage applied to the battery will typically be maintained at or around the nominal voltage of 2.35 Volts per cell. In some types of known charging systems, the current supplied to the battery is held constant instead of the voltage. Such systems are known as "constant current" charging systems. The present invention is applicable to such systems, and to hybrid systems, as well as to the more common systems in which the voltage is kept substantially constant.

In some systems the temperature of the battery is continuously monitored and the charging apparatus controls the voltage applied to the battery in order to take account of that temperature so that the charging voltage applied is the optimum for the particular type of battery at that temperature.

In a constant voltage charging system, as a battery is charged the current flowing into the battery will typically gradually reduce even though the voltage applied is held substantially constant until, as the battery approaches a full state of charge, the current flow tends to level out to a final value. The current into the battery at the point where the battery is substantially fully charged is known as the end of charge current. The present inventors have found that by controlling the amount of charge supplied during charging in dependence on the recorded information relating to the current flow out of and into the battery during the previous discharging phase the increase in the end of charge current can be slowed and the working lifetime of the battery extended.

It is within the scope of the invention to periodically apply to the battery a further charge such as an equalisation charge, which is additional to the desired amount of charge calculated and supplied to the battery in accordance with the method of the first aspect of the invention. For example, once a week the charging system may apply, after the calculated desired amount of charge has been supplied to the battery in accordance with the invention, an equalisation charge.

In one embodiment, the charging of the battery during a charging phase involves calculating the net amount of charge removed from the battery during the previous discharging phase. The term "net amount of charge removed from the battery" as used herein refers to the net amount of charge expended by the battery since it was last at a full state of charge, taking into account any charge that has been supplied to the battery in that time. Charge can be supplied to a battery during a discharging phase in a variety of ways, for example, by the fork lift truck braking systems and by short duration partial charges, as mentioned above. The desired amount of charge to be supplied to the battery is then, in one embodiment, equal to the sum of the net amount of charge lost from the battery plus a predetermined amount. The predetermined amount would vary with the type of battery and would be selected to give the optimum degree of overcharging for that particular type of battery.

Optionally, the method of the first aspect of the invention involves calculating the desired amount of charge to be supplied to the battery during a charging phase by multiplying the calculated net amount of charge lost from the battery by a predetermined charge factor. The charge factor is a number equal to one or preferably greater than one which represents the desired degree of overcharging, that is, the charge factor is the ratio of the desired amount of charge to be returned to the battery to the amount of charge lost from the battery. The charge factor will depend upon the type of battery concerned. Optionally the charge factor is in the range of from 1.01 to 1.40. For example, when the battery is a thin plate pure lead (TPPL) battery, the charge factor is preferably in the range of from 1.01 to 1.12, more preferably, in the range of from 1.01 to 1.08. Where the battery is a flooded lead acid battery, the charge factor is desirably in the range of from 1.05 to 1.30. Where the battery is a gelled lead acid battery, the charge factor is preferably in the range of from 1.05 to 1.20, more preferably, in the range of from 1.08 to 1.10. For batteries at a relatively low depth of discharge, for example, 10 to 30%, lower charge factors may be applicable.

Taking as an example the battery mentioned above which has a total charge capacity of 100 Amp hours, a DOD of 80% equates to a net amount of charge lost from the battery of 80 Amp hours. The DOD of a battery cannot be easily measured directly. However, monitoring of the current flow from the battery during the discharge phase and the recordal of that information allows the calculation of that net amount of charge lost from the battery. Multiplying by a charge factor of, say, 1.03 would give a desired amount of charge to be supplied to the battery during the charging phase of 1.03× 80=82.4 Amp hours.

Optionally, the charge factor used is constant i.e. it does not change through the lifetime of the battery. Alternatively, the charge factor used does vary through the lifetime of the battery. In that embodiment, it is possible to use a particular charge factor which is most suitable for the battery at the relevant point in its lifetime. The charge factor optionally increases during the lifetime of the battery, for example, the charge factor may be increased stepwise when the number of discharge/charge cycles experienced by the battery or the total amount of charge discharged from or supplied to the battery reaches certain predetermined levels. The amount of increase of the charge factor in each step may, for example, be in the range of from 0.001 to 0.05, or preferably from 0.005 to 0.02. The charge factor may optionally be increased when the number of discharge/charge cycles experienced by the battery reaches a multiple of a number in the range of from 10 to 300. As an illustration, in one embodiment a TPPL battery might be charged using a charge factor of 1.03 for the first 300 cycles, at a charge factor of 1.04 for the next 100 cycles, at a charge factor of 1.05 for the next 100 cycles, and so on, until a charge factor of 1.12 is reached, after which it is not increased further. In another variation, the charge factor could be reduced progressively over the early part of the battery's lifetime, say for from the first 100 to 500 cycles, and then be increased during the later part of the lifetime of the battery.

In order to ensure the desired amount of charge is supplied to the battery it is necessary to monitor the supply of charge during charging. Any suitable method of monitoring the amount of charge supplied during the charging phase of the battery may be used. In a preferred embodiment, the current flow into the battery during the charging phase is monitored thereby allowing the amount of charge supplied to the battery to be calculated. Once that amount of charge supplied reaches the calculated desired amount of charge to be supplied to the battery, the charging is stopped.

Some known lead acid battery systems comprise current monitors which are capable of measuring current flow into and out of the battery. For example, the WI-IQ system available from EnerSys includes a current sensor mounted on the battery which uses the Hall effect to monitor the current through the main battery cable.

Any suitable means may be used to measure the current flow into and out of the battery. In one embodiment the current into and out of the battery is measured using a Hall effect sensor. Preferably, however, the current flow into and out of the battery is monitored using a shunt (a current shunt monitor). Shunts are in many cases able to provide a more accurate measurement of the current flow than a Hall effect sensor. Preferably, the current sensor has an accuracy of at least 98%, preferably at least 99%, and more preferably, at least 99.5% for measuring the current flow into and out of the battery during either a discharge phase or a charging phase.

The current flow into a large lead acid battery, for example, of the type used to power fork lift trucks, can vary over a very wide range during the charging of the battery. For example, the peak current could be as much as 250 Amps which would decline slowly during the course of the charging and may reach a value of, for example, 1 Amp or so towards the end of the charging. Some charging systems include means to limit the current such that it does not rise above a predetermined value, for example, 50 Amps. Even with such a current limit, the current will still vary over a wide range during charging of the battery from a significant depth of discharge up to a full state of charge. In a preferred embodiment, the current into and out the battery is monitored by two shunts, a first shunt for monitoring a lower current range and a second shunt for monitoring an upper current range. Preferably, the boundary between the upper current range and the lower current range is within the range of from 1 Amp to 20 Amps, more preferably, within the range of from 2 Amps to 10 Amps, and yet more preferably in the range of from 3 Amps to 7 Amps. For example, the current may be monitored by a first shunt for monitoring a lower current range of no more than 5 Amps and a second shunt for monitoring an upper current range of greater than 5 Amps. The use of multiple shunts allows an increase in monitoring accuracy and it is within the scope of the invention to use more than two shunts, if desired.

The method of the first aspect of the invention may also involve measuring the temperature of the battery during the charging of the battery and adjusting the voltage applied to the battery in dependence on that temperature. Such adjustment of the charging voltage in accordance the battery temperature is well known to those skilled in the art.

The battery may be any lead acid battery. The method of the first aspect of the invention is particularly applicable to batteries which undergo a significant degree of cycling between states of low charge and high charge, but is not limited to such batteries. Batteries in motive power applications typically experience a high level of cycling but some reserve power applications also involve high levels of cycling. Optionally, the battery is a battery used in a motive power application.

The battery may be, for example, a flooded lead acid battery or a valve regulated lead acid (VRLA) battery. The VRLA battery may be an absorbed glass matt or gel-type battery. In one embodiment the battery is a thin plate pure lead (TPPL) lead acid battery. Such TPPL batteries are well known to the skilled person and have plates of a particular alloy having a very high lead content and which have significant advantages in terms of corrosion resistance and higher power and energy density and lower internal resistance over plates made from conventional alloys. TPPL batteries generally have grids having a thickness of 1.50 millimeters or less.

TPPL batteries have until recently been used mainly in reserve power applications but over recent years advances in design have increased the cycling performance to the point where they now find application in motive power applications. For example, the EnerSys XFC battery is a TPPL battery aimed at motive power applications such as pallet trucks and the like. TPPL batteries have the advantages that they a) generally do not require topping up of electrolyte, b) they can be charged more quickly than flooded batteries, for example, in 2 to 5 hours rather than 8 hours, c) they give high power and energy density, d) they charge efficiently and, e) they have lower internal resistance. TPPL battery designs are also available with a high degree of vibration resistance which is, of course, an advantage for motive power applications.

The charging apparatus for use in the method of the first aspect of the invention will involve communication means arranged to obtain information relating to the current flow into and out of the battery during a discharging phase. Preferably, the information is produced by a current sensor located on the battery and recorded by information storage means such as an EPROM also located on the battery, or on the charger or on a separate body and communicated via the communication means to the charging apparatus during the subsequent charging phase. The charging apparatus will also comprise a control means such as a microprocessor arranged to calculate a desired amount of charge to be supplied to the battery based on the information relating to the current flow into and out of the battery during the discharging phase. The apparatus for charging may, for example, also include means to identify each particular battery and to measure and record the amount of charge (i.e. the product of the current and the time) supplied to that battery during each charging phase of that battery and to record a total of that supplied charge.

Preferably, the battery comprises at least one sensor capable of producing information relating to the current flow into and out of the battery and a memory store for recording that information. The communication means may be a wired communication means. The communication means is advantageously a wireless communication apparatus arranged to wirelessly communicate with the monitoring and recording unit on the battery which monitors and records the information relating to the current flow into and out of the battery. Batteries having such units for sensing and recording parameters such as the current supplied to the battery and/or the current discharged from the battery, the temperature of the battery and the electrolyte level of the battery are available from EnerSys Incorporated under the trade name WI-IQ. When such a battery is taken to a charging apparatus the information is transferred wirelessly to the charging apparatus using a wireless communication protocol.

The control means of the charging apparatus preferably includes a microprocessor and a memory store which stores instructions for the microprocessor for calculating the desired amount of charge to be supplied to the battery during charging in dependence of the information relating to the current flow into and out of the battery during the previous discharging phase of the battery.

The energy storage and supply apparatus of the third aspect of the invention includes one or more lead acid batteries and a charging apparatus as described above. The energy storage and supply apparatus may be, for example, a plurality of motive power batteries and one or more charging apparatus as described above. Each battery can, of course, include one or more cells as is well known in the art.

The invention provides in a fourth aspect a method of operating a lead acid battery in which the battery is at least partially discharged and is then charged and which includes a) monitoring the current flow out of and any current flow into the battery during the discharging of the battery, b) calculating from the recorded values of the current flow the net amount of charge removed from the battery since it was last at a full state of charge, c) then calculating an amount of charge to be supplied to the battery during charging by multiplying the net amount of charge removed by a charge factor, and d) supplying the calculated desired amount of charge to the battery to charge it.

In a particular embodiment, the invention also provides in a fifth aspect an energy storage and supply apparatus comprising
a plurality of lead acid batteries, each battery being provided with a sensor to measure the current flow into and out of the battery and means to record information relating to that current flow, and
a charging apparatus for charging the batteries comprising a communication system to obtain the recorded information from a battery being charged, a microprocessor arranged to calculate the desired amount of charge to be supplied to the battery based upon that recorded information and based upon a predetermined charge factor, and means to supply that desired amount of charge to the battery thereby charging it.

The invention provides in a sixth aspect a charging apparatus for charging a lead acid battery comprising a communication system arranged to obtain information from the battery relating to the net amount of charge removed from the battery since it was last in a full state of charge, a microprocessor arranged to calculate, based upon that information and based upon a predetermined charge factor, a desired amount of charge to be supplied to the battery, and current supply means arranged to supply the calculated desired amount of charge to the battery, thereby charging the battery.

The charging apparatus of the second and sixth aspects of the invention and the energy storage and supply apparatus of the third and fifth aspects of the invention are desirably arranged to operate according to the method of the first aspect of the invention, and the preferred features of the method of the first aspect of the invention described above apply also to those other aspects as preferred features of those other aspects of the invention. Those preferred features of the method of the first aspect of the invention are also preferred features of the method of the fourth aspect of the invention.

In one embodiment, the method of the first aspect of the invention is applied to the battery throughout its entire lifetime. In a separate embodiment, the battery is operated according to the method of the first aspect of the invention during only part of its lifetime. During the remaining part or parts of the battery's lifetime it may be operated according to another regime, for example, a conventional charging and charging regime. Optionally, during at least one period in its lifetime the battery is operated according to a method in which the voltage applied during charging is varied in a predetermined way through that period of the lifetime of the battery. Such a method is described in our co-pending Patent Application filed on the same day of the present application and entitled "A Method and Apparatus for Charging a Battery". In that embodiment, the battery is operated according to the method of the first aspect of the invention during one period of its lifetime and during another period of its lifetime is operated according to a second method in which the battery undergoes discharging phases during which the battery is discharged and charging phases during which the battery is charged and which involves:

a) monitoring and recording information relating to the discharging and/or charging history of the battery;

b) during a charging phase connecting the battery to a charging apparatus and applying a voltage to the battery wherein the voltage is adjusted in dependence on the recorded information relating to the discharging and/or charging history of the battery.

In essence, during the period of operation according to the method of the first aspect of the invention the charging is based upon supplying an amount of charge which exceeds by a predetermined degree the net amount of charge removed from the battery since it was last in a substantially fully charged state whereas in the period of operation according to the second method charging is based upon applying a charging voltage which is optimised in relation to the amount of use the battery has had, typically expressed in terms of the number of discharge/charge cycles experienced or the total amount of charge discharged from or charged to the battery.

Preferably, the battery is operated in an initial first period according to the second method and in a subsequent, second period is operated according to the method of the first aspect of the invention.

In accordance with this embodiment, the working lifetime of a lead acid battery may be extended if, during part of the lifetime of the battery, the voltage applied during charging is controlled at least in part in dependence on the history of the battery, in particular, the discharging and/or charging history of the battery. The control of the voltage typically involves selecting a voltage to be applied to the battery during charging. Thus, by varying the voltage applied to the battery during charging according to where the battery is in its working lifetime side reactions occurring during charging of the battery may be reduced, thereby extending the working lifetime of the battery.

This embodiment of the invention is applicable to any charging system which applies a set voltage during the whole or part of the charging phase. The second method is particularly applicable to constant voltage systems and hybrid systems. In the latter type of system, the voltage applied during the constant voltage portions of the charging phase may be controlled in accordance with the second method.

Over the lifetime of the battery the cycling between discharged and charged states occurs many times. For example, a battery having a total charge capacity of 100 Amp hours might be specified by the manufacturer to give 600 discharge/charge cycles at a level of 80% depth-of-discharge. The total intended energy capacity over the battery over its working lifetime can be calculated as 100 Amp hours×0.80×600 which equals in total 48,000 Amp hours.

The information relating to the discharging and/or charging history of the battery may relate, for example, to the discharging history of the battery over its lifetime or may relate to the charging history of the battery over its lifetime or may relate to both the discharging and the charging history of the battery over its lifetime. The information may relate, for example, to the total amount of charge which has been discharged from the battery through its lifetime. Alternatively, the information may relate, for example, to the total amount of charge which has been supplied to the battery during its lifetime. Optionally, the information relates to the number of discharging phases the battery has experienced. Optionally, the information relates to the number of charging phases the battery has experienced.

In a preferred embodiment the voltage applied to the battery during charging according to the second method is adjusted in dependence on recorded information relating to the discharging and/or charging history of the battery such that the voltage applied to the battery during charging phases progressively reduces over the lifetime of the battery. The voltage applied to the battery in accordance with the second method must not be reduced below the minimum voltage required to input charge into the battery, which is typically around 2.21 Volts per cell. The initial voltage applied during the first charging phase a new battery experiences will typically be substantially higher than that minimum voltage in order that the battery be charged within a reasonable time frame. For example, when operating according to the second method the voltage applied to the battery during the initial charging phase may be in the region of 2.25 to 2.60 Volts per cell, for example, within the range of 2.35 to 2.50 Volts per cell, and especially preferably may be in the range from 2.35 to 2.45 Volts per cell depending on the specific lead acid chemistry involved. The selection of the voltage may also be influenced by the ambient temperature of the battery. The voltage applied to the battery during charging phases is optionally reduced continuously over the period of the lifetime of the battery during which the battery is operated according to the second method. Optionally, the voltage applied to the battery during charging phases is reduced stepwise over the period of the lifetime of the battery during which it is operated according to the second method.

Optionally, when operating according to the second method the information relating to the discharging and/or charging history of the battery relates to at least one parameter relating to the discharging and/or charging history of the battery, and the voltage applied to the battery is adjusted such that it reduces stepwise at predetermined values of the parameter. For example, the parameter may be the total charge applied to the battery during previous charging phases. As an illustration, a battery of the type mentioned above having an intended total energy capacity over its planned lifetime of 48,000 Amp hours may have experienced 150 charging phases receiving on average 80 Amp hours during each charging phase, making a total charge supplied to the battery of 80 Amp hours×150=12,000 Amp hours. The battery would therefore be 25% of the way through its intended lifetime.

The extent of each stepwise reduction and the number of stepwise reductions in voltage made over the period during which the battery is operated according to the second method may vary over a wide range, always bearing in mind the need to keep the voltage per cell applied to the battery at a level which will achieve charging of the battery at a practicable time. The minimum stepwise reduction which it is feasible to apply will be determined in practice by the minimum voltage change which can be sensed by the system. The or each step change in voltage may be, for example, in the region of from 1 to 50 millivolts per cell, optionally from 1 to 30 millivolts per cell, preferably in the range of from 2 to 20 millivolts per cell, and more preferably in the range of from 2 to 10 millivolts per cell. The number of step changes applied over the period during which the battery is operated according to the second method Will be preferably at least two and may, for example, be in the range of from 2 to 20, more preferably in the range of from 5 to 15. The steps may be at regular intervals or irregular intervals. Preferably, they are at regular intervals. For example, the second method may involve reducing the charging voltage applied to the battery by a level in the range from 1 to 50 millivolts per cell, more preferably from 2 to 30 millivolts per cell, at regular intervals in the range of from 2 to 20% of the intended total energy planned for the battery over its planned lifetime. Put another way, in one embodiment when the total energy supplied to or discharged from the battery reaches a percentage which is in the range of from 2 to 20% of its intended total energy capacity, or a multiple of that percentage, the voltage applied during charging may be reduced by an amount in the range of from 1 to 50 millivolts per cell, preferably from 2 to 30 millivolts per cell. For example, for a battery having a total planned energy capacity over its lifetime of 48,000 Amp hours the second method may involve reducing the voltage applied during charging by 10 millivolts per cell every time the total charge supplied to the battery during charging reaches 4800 Amp hours (10% of the intended lifetime of the battery) or a multiple thereof.

References herein to discharging a battery should not be taken to imply that the battery is completely discharged unless the context makes it clear that is the intended meaning. In fact, batteries are typically discharged to a depth-of-discharge of less than 100%, for example, to less than 80%, in order to avoid damage to the battery.

It will be appreciated that references herein to adjusting or controlling the voltage applied to the battery during charging in dependence on information relating to the discharging and/or charging history of the battery when operating the battery according to the second method should not be taken to imply that the voltage is controlled solely with reference to that information. In many cases the actual voltage applied to the battery during charging according to the second method will be controlled in accordance with several different criteria of which the information relating to the discharging and/or charging history of the battery is only one. Such other criteria will typically include a current limit and the battery temperature. Furthermore, when the charging system applies a current limit during the early part of the charging phase, the current flowing into that battery will typically be at that limit (assuming the battery is at a significant depth-of-discharge) and so during that part of the charging phase the adjustment of the voltage in dependence on the information relating to the discharging and/or charging history of the battery will typically have no effect on the current flow. As the battery approaches a full state of charge the current supply to the battery will typically reduce well below the current limit. The adjustment of the voltage in dependence on the information relating to the discharging and/or charging history of the battery will therefore have most effect during that latter part of the charging cycle.

The second method may also involve measuring the temperature of the battery during the charging of the battery and adjusting the voltage applied to the battery in dependence on that temperature.

Accordingly, when operating the battery according to the second method the actual voltage applied to the battery at any moment during a charging cycle will typically be controlled by one or more factors of which the information relating to the discharging and/or charging history of the battery is only one. The important thing is that if all of the other factors are equal (for example, assuming that any current limit does not apply and assuming equal temperatures) the voltage applied to the battery will be changed in dependence on that information, for example, to reduce the voltage applied during charging as the battery passes through the period of its working lifetime in which it is operated according to the second method.

The second method of operating the battery may involve the steps of i) providing a predetermined initial base charging voltage, ii) reducing that predetermined initial base charging voltage in dependence on the discharging and/or charging history of the battery to give an adjusted charging voltage, iii) optionally further adjusting that adjusted base charging voltage in dependence on a current limit and/or the temperature of the battery and iv) applying the adjusted charging voltage, or, if applicable, the further adjusted charging voltage, to the battery, thereby charging the battery.

The charging apparatus for use in the second method will involve means to obtain information relating to the discharging and/or charging history of the battery and a control means arranged to control a voltage applied to the battery during charging of the battery in dependence on that information relating to the discharging and/or charging history of the battery. The apparatus for charging may, for example, include means to identify each particular battery and to measure and record the amount of charge (i.e. the product of the current and the time) supplied to that battery during each charging phase of that battery and to record a total of that supplied charge. Preferably, the charging apparatus is capable of operating according to the method of the first aspect of the invention and according to the second method.

The control means of the charging apparatus preferably includes a microprocessor and a memory store which stores instructions for the microprocessor for operating according to the second method by selecting the voltage to be applied to the battery during charging in at least partial dependence of the information relating to the discharging and/or charging history of the battery. Those instructions will preferably be in the form of an algorithm. For example, the instructions may be in the form of an algorithm which selects the voltage to be applied to the battery in dependence on at least:

1) the information relating to the discharging and/or charging history of the battery, and
2) the temperature of the battery.

An embodiment of the invention will now be described for the purposes of illustration only, with reference to drawing, in which FIG. 1 shows a graph of the end of discharge Volts plotted against the number of discharge/charge cycles experienced by a lead acid battery;

An SBS Eon lead acid battery (available from EnerSys) was subjected to repeated discharge/charge cycles. During each discharge phase, the battery was discharged to a nominal 60% depth-of-discharge (DOD) of the 10 hour rate capacity by discharging at a constant current for a predetermined length of time. Following each discharge phase, the battery was charged at a constant voltage of 2.40 Volts per cell to a charge factor of 1.03 i.e. the amount of charge supplied to the battery was 1.03 times the amount of charge discharged. The amount of charge supplied to the battery during each charging phase was calculated by monitoring the current into the battery and the time. When the desired amount of charge supplied was reached, the charging was stopped.

Figure 1:
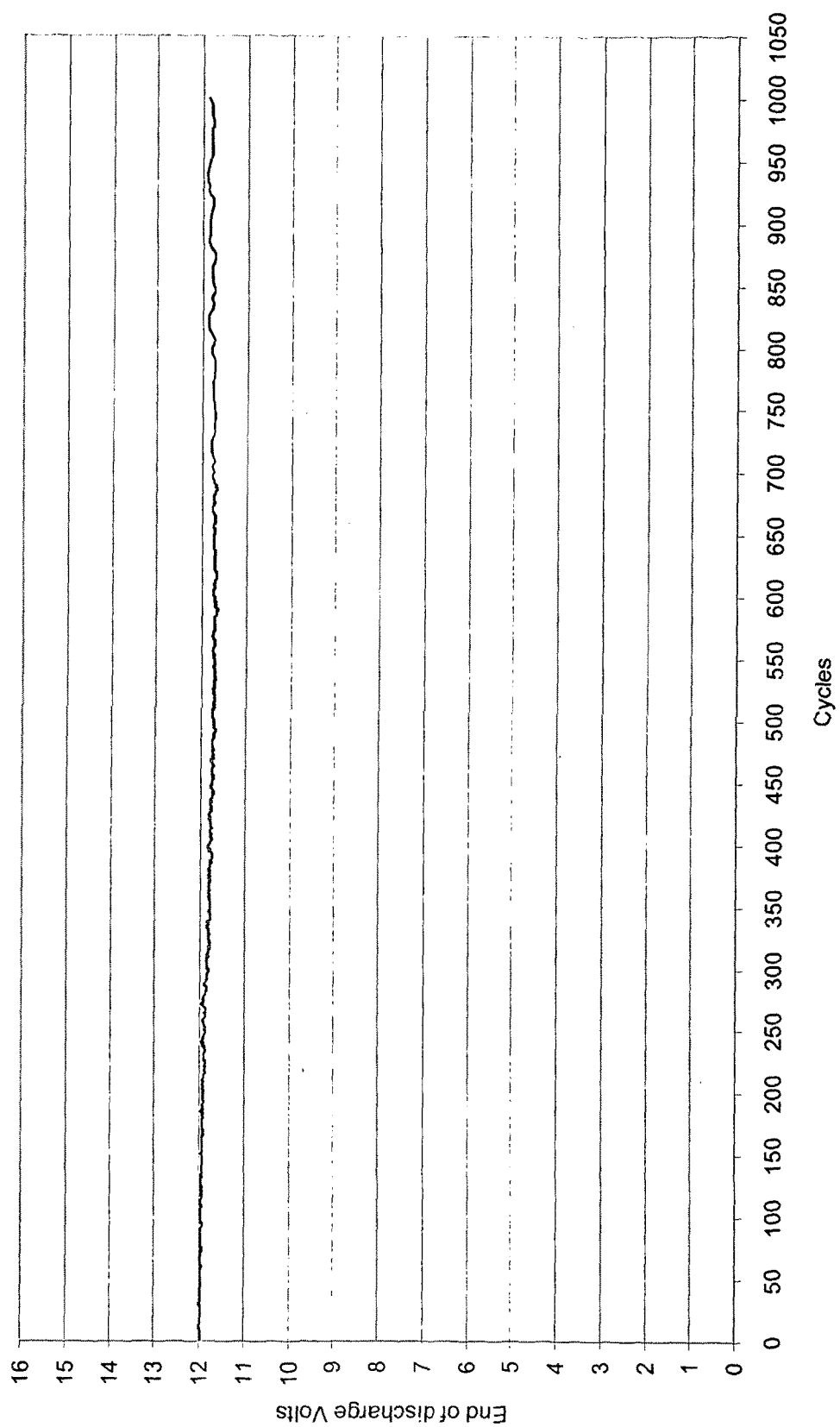

FIG. 1 shows the Voltage at the end of each discharging phase plotted against the number of cycles experienced by the battery. As can be seen, the end of discharge Voltage falls slightly over the first 350 cycles of so, but then remains approximately constant, even up to 1000 cycles. That indicates that the side reactions which are believed to cause damage to the battery are not increasing over that range of cycles. In a conventional charging programme, in which the charge supplied is not limited in dependence on the charge lost from the battery, it would be expected that a significant decrease in the end of discharge Volts or even complete failure of the battery would be seen by 1000 cycles.

Figure 2:
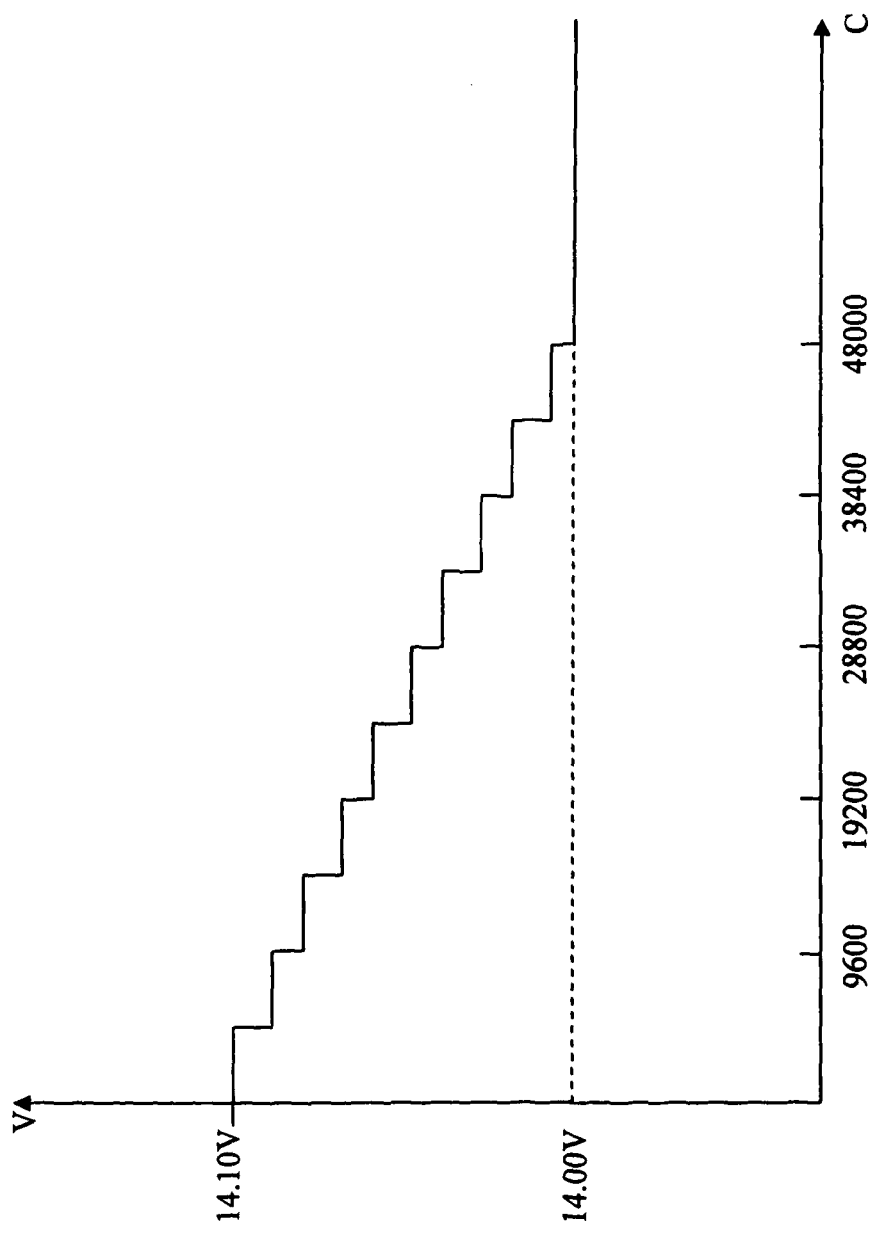
FIG. 2 shows an example of a plot of charging voltage versus total charge supplied to the battery during part of its lifetime in accordance with the second method of operating the battery.

FIG. 2 shows an example of a profile of the charging voltage applied to a battery during an initial part of its lifetime in accordance with the second method of operation. The voltage applied to the battery during charging (ignoring any adjustments made to take account of battery temperature and other factors) starts at an initial predetermined value of 14.1 Volts, corresponding to 2.35 Volts per cell for a 6 cell battery. The battery is designed by the manufacturer to have a charge capacity of 200 Amp hours and to have a specified lifetime of 1200 cycles at 80% depth-of-discharge. Accordingly, the total energy capacity specified for the battery is 96,000 Amp hours. In FIG. 2 the total charge C supplied to the battery during charging is shown on the X axis. As depicted in FIG. 2, the voltage applied during charging is reduced stepwise at regular intervals of 4,800 Amp hours during the first half of the lifetime of the battery and eventually reaches 14.0 Volts at a total charge supplied during charging of 48,000 Amp hours, corresponding to 50% of the specified life of the battery. Subsequently, charging is carried out according to the method of the first aspect of the invention, using a charge factor 1.03.

Figure 3:
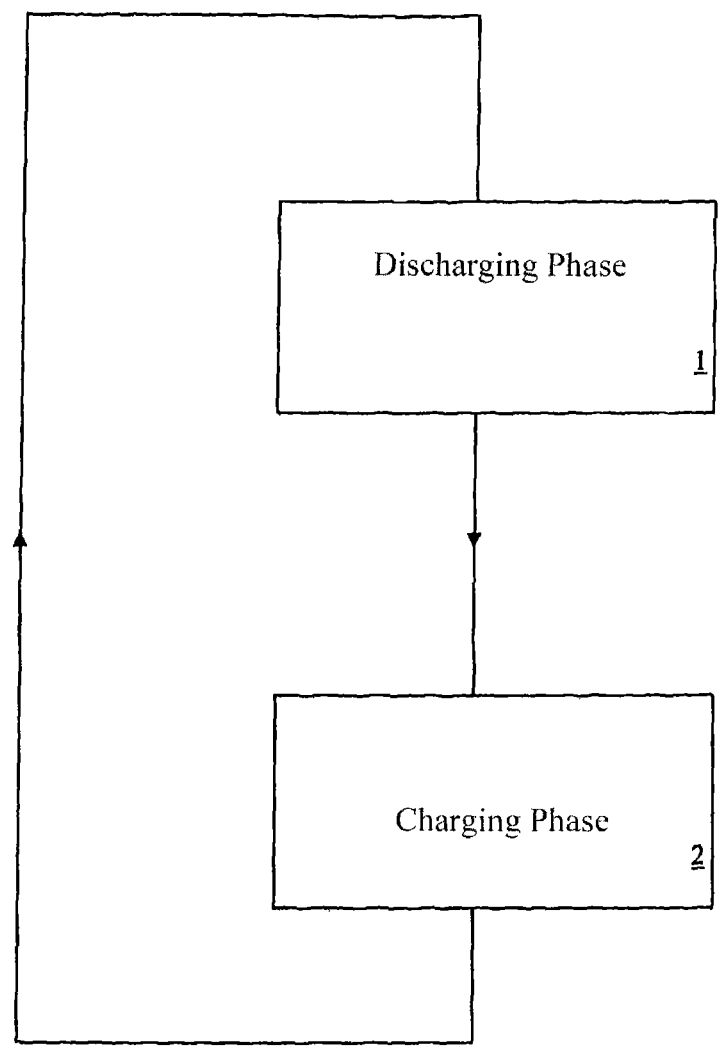
FIG. 3 illustrates an embodiment of the method of the first and fourth aspects of the invention.

FIG. 3 illustrates schematically an embodiment of the method of the invention. A lead-acid battery, for example a battery on a fork-lift truck, is discharged in a discharging phase 1, for example, during a day shift of operating the fork-lift truck. At the end of the discharging phase 1, the battery is partially discharged, and the operator then connects it to a charging apparatus so it can be charged in a charging phase 2, for example, an overnight charging period. After the charging phase 2, the battery is disconnected from the charging apparatus and is used in another discharging phase 1, for example to power the fork-lift truck again in another day shift. During its lifetime the battery will experience many cycles of discharging and charging.

During the discharging phase 1, the current flow out of the battery over time is monitored and, for example, the total charge lost from the battery during the discharging phase 1 is calculated and recorded. During the following charging phase 2, the charging apparatus obtains the recorded information from the battery and calculates, based on that recorded information, a desired amount of charge to be supplied to the battery. For example, that desired amount of charge may be calculated by multiplying the amount of charge discharged from the battery during the discharging phase 1 by a predetermined charge factor. The apparatus then monitors the current supplied to the battery over time during charging phase 2 and ceases charging when the charge supplied during phase 2 reaches the desired amount of charge.

In the embodiment where the method of the first and fourth aspects of the invention is applied during only a part of the lifetime of the battery, and during another part of the lifetime of the battery an alternative, second method is used, in which the voltage applied during a charging phase 2 is selected based on recorded information relating to the discharging and/or charging history of the battery over its lifetime, the recorded information may be, for example, the number of discharging phases 1 which the battery has experienced in its lifetime, or the total amount of charge expended from the battery during discharging phases 1 over its lifetime, or the total amount of charge provided to the battery during charging phases 2 over its lifetime. The voltage applied may also be influenced by other factors, for example, the temperature of the battery.

Figure 4:
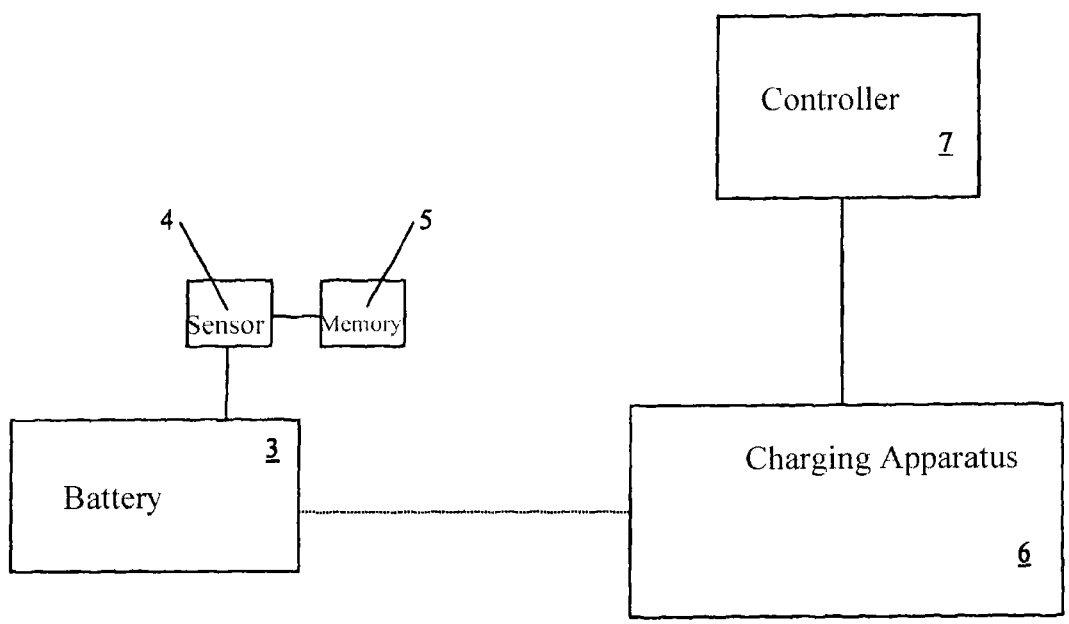
FIG. 4 illustrates an embodiment of the energy storage and supply apparatus of the invention.

FIG. 4 illustrates schematically an embodiment of an energy supply and storage apparatus according to the invention. The apparatus includes a lead-acid battery 3 which is provided with a sensor 4 for monitoring the current flow into and out of the battery and a memory 5 for recording and storing information relating to the monitored current flow into and out of the battery.

During use of the battery 3 in a discharging phase, for example, to power a fork-lift truck during a shift, the sensor 4 monitors the current flow out of the battery over time and information relating to that current flow, for example, the total charge discharged from the battery during discharging phase 1, is recorded and stored in memory 5. Following the discharging phase, the battery is connected to a charging apparatus 6 which includes a controller 7. The controller 7 may be, for example, a microprocessor operating according to an algorithm.

The controller 7 obtains from memory 5, for example, via a wireless communicator system, the stored information relating to the current flow during discharging phase 1, and uses that information to calculate a desired amount of charge to be provided to the battery 3 during the charging phase. The charging apparatus 6 then applies a voltage to the battery 3 and the current flow into the battery during the charging phase is monitored by sensor 4, and communicated to controller 2, thereby allowing controller 2 to calculate the amount of charge supplied during the charging phase. When the desired amount of charge is reached, charging apparatus 6 ceases to supply current to the battery 3.

In the embodiment of the invention mentioned above where, for part of its lifetime, the battery operates according to a second method, the controller 7 may be arranged to obtain from the battery 3 information stored in the memory 5 which relates to the charging and/or discharging history of the battery 3. For example, the controller 7 may be arranged to obtain information relating to the total charge supplied to and/or from the battery 3 over its lifetime, or the number of times it has been discharged and/or charged. The controller 7, which may for example, be a microprocessor arranged to operate according to an algorithm, is in that second method arranged to select a voltage to be applied to the battery 3 in dependence upon that information, thereby charging the battery 3. The battery 3 may also include a temperature sensor, and the controller 7 may be arranged to also take the temperature into account when selecting the voltage to be applied to the battery 3.

While the foregoing is directed to embodiments of the present invention, other and further embodiments may be devised without departing from the basic scope thereof, and the scope thereof is determined by the claims that follow.

The invention claimed is:

1. A method of operating a lead acid battery in which the battery undergoes discharging phases during which the battery is partially discharged and charging phases during which the battery is charged, wherein the battery is operated according to a first method during one period of its lifetime, the first method comprising:
   during a discharging phase during which the battery is partially discharged, monitoring the current flow out of and into the battery, and recording information relating to that current flow; and
   during a subsequent charging phase, calculating, based upon that recorded information, a desired amount of charge to be supplied to that battery, and supplying that desired amount of charge to the battery, wherein the charging of the battery during a charging phase involves calculating the net amount of charge removed from the battery, and wherein the desired amount of charge to be supplied to the battery is calculated by multiplying the calculated net amount of charge removed from the battery by a predetermined charge factor; and
   wherein the battery is operated according to a second method during another period of its lifetime, the second method comprising:
   monitoring and recording information relating to the discharging and/or charging history of the battery; and
   during a charging phase connecting the battery to a charging apparatus and applying a voltage to the battery wherein the voltage is adjusted in dependence on the recorded information relating to the discharging and/or charging history of the battery;
   wherein the battery lifetime has a first period and second, later period, in which the battery is operated according to the first method during only one of the first and second periods, and in which the battery is operated according to the second method during only the other one of the first and second periods.

2. A method as claimed in claim 1 in which the charge factor varies though the lifetime of the battery.

3. A method as claimed in claim 2 in which the charge factor increases over the lifetime of the battery.

4. A method as claimed in claim 2 in which the charge factor decreases in a first part of the lifetime of the battery and then increases in a second, later part of the lifetime of the battery.

5. A method according to claim 1 in which the battery is a thin plate pure lead (TPPL) battery and in which the predetermined charge factor is within the range of from 1.01 to 1.12.

6. A method according to claim 1 in which the battery is a flooded battery and the predetermined charge factor is within the range of from 1.05 to 1.30.

7. A method according to claim 1 in which the battery is a gelled battery and in which the predetermined charge factor is within the range of from 1.05 to 1.20.

8. A method as claimed in claim 1 in which during the charging phase current flow into the battery is monitored thereby allowing the amount of charge supplied to the battery to be calculated.

9. A method according to claim 1 in which the current flow into and out of the battery is monitored using a shunt.

10. A method according to claim 9 in which the current into and out of the battery is monitored by two shunts, a first shunt for monitoring a lower current range and a second shunt for monitoring an upper current range.

11. A method of operating a lead acid battery as claimed in claim 1 in which the battery is operated in the initial, first period according to the second method and in which in the subsequent, second period is operated according to the first method.

12. A method of operating a lead acid battery as claimed in claim 1 in which in the second method the voltage is adjusted in dependence on the recorded information relating to the discharging and/or charging history of the battery such that the voltage applied to the battery during charging phases progressively reduces over the period the battery is operated according to the second method.

13. A method of operating a lead acid battery as claimed in claim 1 in which in the second method the information relates to at least one parameter relating to the discharging and/or charging history of the battery, and the voltage applied to the battery is adjusted such that it reduces stepwise at predetermined values of the parameter.

14. A method of operating a lead acid battery as claimed in claim 1 in which in the second method the information relating to the discharging and/or charging history of the battery is the total charge discharged from the battery or the total charge supplied to the battery during charging.

15. A method of operating a lead acid battery as claimed in claim 1 in which in the second method the information relating to the discharging and/or charging history of the battery is the total charge supplied to the battery during charging.

16. A method of operating a lead acid battery as claimed in claim 1 in which the second method also involves measuring the temperature of the battery during the charging of the battery and adjusting the voltage applied to the battery in dependence on that temperature.

* * * * *